(12) United States Patent
Yang et al.

(10) Patent No.: US 10,818,694 B2
(45) Date of Patent: Oct. 27, 2020

(54) ARRAY SUBSTRATE, PREPARATION METHOD THEREOF AND DISPLAY PANEL

(71) Applicant: BOE TECHNOLOGY GROUP CO., LTD., Beijing (CN)

(72) Inventors: Wei Yang, Beijing (CN); Hehe Hu, Beijing (CN); Xinhong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/166,356

(22) Filed: Oct. 22, 2018

(65) Prior Publication Data

US 2019/0123069 A1 Apr. 25, 2019

(30) Foreign Application Priority Data

Oct. 23, 2017 (CN) .......................... 2017 1 0999043

(51) Int. Cl.
*H01L 27/12* (2006.01)
*H01L 29/786* (2006.01)
(Continued)

(52) U.S. Cl.
CPC ........ *H01L 27/1218* (2013.01); *H01L 27/124* (2013.01); *H01L 27/1225* (2013.01); *H01L 27/1248* (2013.01); *H01L 27/1251* (2013.01); *H01L 27/1262* (2013.01); *H01L 27/1296* (2013.01); *H01L 29/66757* (2013.01);
(Continued)

(58) Field of Classification Search
CPC ............. H01L 27/1218; H01L 27/1225; H01L 27/124; H01L 27/1248; H01L 27/1251; H01L 27/1262; H01L 27/1296; H01L 29/66757; H01L 29/66969; H01L 29/78675; H01L 29/7869
See application file for complete search history.

(56) References Cited

U.S. PATENT DOCUMENTS 9,490,370 B2 * 11/2016 Yamazaki .......... G11C 16/0425
2010/0213531 A1    8/2010 Asami et al.
(Continued)

FOREIGN PATENT DOCUMENTS

CN    102005413 A    4/2011
CN    104867937 A    8/2015
(Continued)

OTHER PUBLICATIONS

First Office Action for CN Appl. No. 201710999043.9, dated Sep. 29, 2019.

*Primary Examiner* — Allan R Wilson
(74) *Attorney, Agent, or Firm* — Dinsmore & Shohl LLP

(57) ABSTRACT

The present disclosure relates to array substrate, preparation method thereof and display panel. An array substrate comprises: a first thin film transistor and a second thin film transistor over a substrate; wherein the first thin film transistor comprises a first portion of a first insulating layer, the first insulating layer comprises a first recess corresponding to the second thin film transistor, and the second thin film transistor is located in the first recess; and wherein a thickness of a second portion of the first insulating layer, which is below the bottom of the first recess, is smaller than that of the first portion of the first insulating layer.

11 Claims, 7 Drawing Sheets

(51) Int. Cl.
*H01L 29/66* (2006.01)
*H01L 27/32* (2006.01)

(52) U.S. Cl.
CPC .... *H01L 29/66969* (2013.01); *H01L 29/7869* (2013.01); *H01L 29/78675* (2013.01); *H01L 27/1255* (2013.01); *H01L 27/3258* (2013.01); *H01L 27/3262* (2013.01); *H01L 27/3265* (2013.01); *H01L 27/3276* (2013.01)

(56) References Cited

U.S. PATENT DOCUMENTS

| | | | |
|---|---|---|---|
| 2011/0084271 A1* | 4/2011 | Yamazaki | H01L 27/1214 257/43 |
| 2011/0156117 A1* | 6/2011 | Yamazaki | H01L 29/7869 257/300 |
| 2011/0175087 A1* | 7/2011 | Yamazaki | H01L 21/8221 257/57 |
| 2013/0193493 A1* | 8/2013 | Yamazaki | H01L 29/78 257/288 |
| 2013/0207112 A1* | 8/2013 | Isobe | H01L 27/1225 257/57 |
| 2015/0243718 A1* | 8/2015 | Kwon | H01L 27/1248 257/43 |
| 2015/0243724 A1* | 8/2015 | Cho | H01L 29/7869 257/43 |
| 2015/0371589 A1* | 12/2015 | Kim | G09G 3/3258 345/208 |
| 2019/0259822 A1* | 8/2019 | Jeon | H01L 27/3262 |

FOREIGN PATENT DOCUMENTS

| | | |
|---|---|---|
| CN | 105225633 A | 1/2016 |
| CN | 107004682 A | 8/2017 |

* cited by examiner

Forming a polysilicon active layer, a first gate insulating layer, a first gate electrode, and a first interlayer insulating layer of the first thin film transistor sequentially over the substrate having the buffer layer formed thereon; the first insulating layer comprising the first gate insulating layer and the first interlayer insulating layer —S10

Forming first through hole(s) penetrating through the first interlayer insulating layer and the first gate insulating layer, and meanwhile in the region of the second thin film transistor, Removing the first interlayer insulating layer, the first gate insulating layer, and the buffer layer to expose a part of the substrate —S11

Forming a first source electrode and a first drain electrode, the first source electrode and the first drain electrode respectively in contact with the polysilicon active layer through the first through holes —S12

Forming a second thin film transistor, wherein the second thin film transistor comprises a second gate, a second gate insulating layer, an oxide active layer, a second source electrode, and a second drain electrode; the second gate, or the second source electrode and the second drain electrode formed in synchronization with the first source electrode and the first drain electrode; the second gate insulating layer also covering the first source electrode and the first drain electrode —S13

FIG. 11

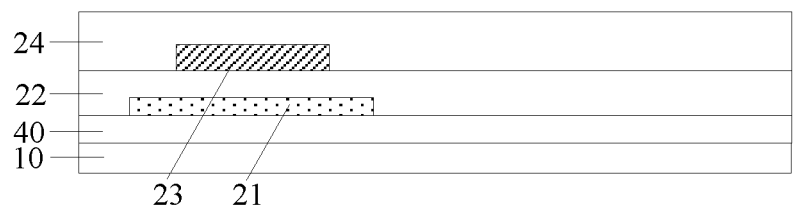

FIG. 12a

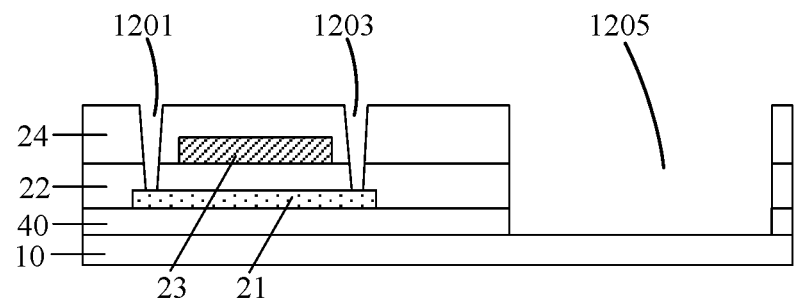

FIG. 12b

ARRAY SUBSTRATE, PREPARATION METHOD THEREOF AND DISPLAY PANEL

CROSS-REFERENCE TO RELATED APPLICATIONS

The present application claims priority to Chinese Patent Application No. 201710999043.9, filed on Oct. 23, 2017, which is hereby incorporated in its entirety by reference.

TECHNICAL FIELD

The present disclosure relates to the field of display technologies, and in particular, to an array substrate, a method for fabricating the same, and a display panel.

BACKGROUND

Recently, the combination of two types of thin film transistors has attracted much attentions in the display industry, which has greatly improved user experience of display products.

However, in terms of process, the performance of the type of thin film transistor that is fabricated later than the other may be affected by the uniformity matter of the insulating layer(s) that has already been formed.

SUMMARY

According to an aspect of the present disclosure, there is provided an array substrate comprising: a first thin film transistor and a second thin film transistor over a substrate; wherein the first thin film transistor comprises a first portion of a first insulating layer, the first insulating layer comprises a first recess corresponding to the second thin film transistor, and the second thin film transistor is located in the first recess; and wherein a thickness of a second portion of the first insulating layer, which is below the bottom of the first recess, is smaller than that of the first portion of the first insulating layer.

In some embodiments, the second portion of the first insulating layer has a thickness of 0 μm. For instance, the second portion may not be present, or is not included in or part of the first insulating layer.

In some embodiments, the array substrate further comprises: a buffer layer disposed between a surface of the substrate and the first thin film transistor; wherein the buffer layer comprises a second recess corresponding to the second thin film transistor, and the first recess and the second recess are stacked; and wherein, a thickness of a portion of the buffer layer, which is below the bottom of the second recess, is smaller than that of a portion of the buffer layer which is below the first thin film transistor.

In some embodiments, the first thin film transistor and the second thin film transistor are respectively a polysilicon thin film transistor and an oxide thin film transistor.

In some embodiments, the first thin film transistor is a top gate type thin film transistor, and the first thin film transistor comprises a first gate insulating layer and/or a first interlayer insulating layer; and wherein the first insulating layer comprises the first gate insulating layer and/or the first interlayer insulating layer.

In some embodiments, the first thin film transistor further comprises a first source electrode and a first drain electrode; the second thin film transistor comprises a second gate electrode, a second source electrode, and a second drain electrode; one of the following is disposed in a same layer as the first source electrode and the first drain electrode are disposed: the second gate electrode, or the second source electrode and the second drain electrode.

In some embodiments, the array substrate further comprises: a lead region, the lead region having a through-hole which comprises a first sub-through-hole and a second sub-through-hole which are stacked, the second sub-through-hole being disposed adjacent to the substrate, and an aperture of the second sub-through-hole being smaller than an aperture of the first sub-through-hole; and a conductive layer disposed at the second sub-through-hole.

In some embodiments, the first recess penetrates through same layer or layers as the first sub-through-hole penetrates through; and the second recess penetrates through same layer or layers as the second sub-through-hole penetrates through.

In some embodiments, the substrate is a flexible substrate; the array substrate further comprising a first organic layer disposed at the through-hole, wherein the first organic layer is located on a side of the conductive layer, which is adjacent to the substrate, and the first organic layer covers a bottom surface and a side surface of the through-hole.

In some embodiments, the array substrate further comprises: a second organic layer, wherein the second thin film transistor is disposed over the second organic layer; and wherein the second organic layer is disposed in a same layer as the first organic layer is disposed.

In some embodiments, at least a portion of the second thin film transistor is disposed directly on the substrate.

According to another aspect of the present disclosure, there is provided a display panel comprising the array substrate of any embodiments.

According to a further aspect of the present disclosure, there is provided a method of preparing an array substrate comprising: providing a substrate structure including a substrate and at least a portion of a first thin film transistor and a first insulating layer over the substrate, the first thin film transistor including at least a portion of the first insulating layer; removing at least a portion of a thickness of a region of the first insulating layer corresponding to a second thin film transistor, to form at least first portion of a recess; and forming the second thin film transistor in the recess.

In some embodiments, wherein the substrate structure further comprises a buffer layer disposed between the first thin film transistor and the substrate, wherein the removing forms the first portion of the recess, before the forming the first thin film transistor, the method further comprising: removing at least a portion of a thickness of a region of the buffer layer corresponding to the second thin film transistor, to form a second portion of the recess.

In some embodiments, the first thin film transistor is a top gate thin film transistor which comprises a first gate insulating layer and/or a first interlayer insulating layer, the first insulating layer comprises the first gate insulating layer and/or the first interlayer insulating layer; the first thin film transistor further comprises a first source electrode and a first drain electrode; the second thin film transistor comprises a second gate electrode, a second source electrode, and a second drain electrode; the first source electrode, the first drain electrode, and one of the following are formed by a same patterning process: the second gate electrode, or the second source electrode and the second drain electrode.

In some embodiments, the first thin film transistor further comprises a first through-hole which is configured so that the first source electrode and the first drain electrode of the first thin film transistor is in contact with the first active layer; and the first through-hole and one of the following are formed by a same patterning process: the first portion of the recess, or the first portion and the second portion of the recess.

In some embodiments, the method further comprises: forming a second through-hole in a lead region of the array substrate, and a conductive layer at the second through-hole, wherein the second through-hole comprises a first sub-through-hole and a second sub-through-hole which are stacked, the second sub-through-hole being adjacent to the substrate, and the second sub-through-hole having a smaller aperture than an aperture of the first sub-through-hole.

In some embodiments, the method further comprises: forming a first organic layer at the second through-hole, wherein the first organic layer is located on a side of the conductive layer which is adjacent to the substrate, and the first organic layer covers the second through-hole.

In some embodiments, the method further comprises: forming a first organic layer and a second organic layer by a same patterning process; wherein the first organic layer is located on a side of the conductive layer which is adjacent to the substrate, and the first organic layer covers the second through-hole; and wherein the second organic layer is formed in a region of the second thin film transistor, and the second thin film transistor is formed over the second organic layer.

In some embodiments, the first portion of the recess and the first sub-through-hole are formed by a same patterning process; and the second portion of the recess and the second sub-through-hole are formed by a same patterning process.

BRIEF DESCRIPTION OF THE DRAWINGS

In order to more clearly illustrate the embodiments of the present disclosure or the technical solutions in the prior art, the drawings to be used in describing the embodiments or the prior art will be briefly described below. It is apparent that the drawings are only some of the embodiments of the present disclosure, and from these drawings other drawings or embodiments can be readily obtained by those skilled in the art.

FIG. 11 is a schematic flow chart of preparing a first thin film transistor and a second thin film transistor according to some embodiments of the present disclosure;

FIG. 12a is a partial cross-sectional view showing that a polysilicon active layer, a first gate insulating layer, a first gate electrode, and a first interlayer insulating layer of a first thin film transistor are sequentially formed over a buffer layer, according to some embodiments of the present disclosure;

FIG. 12b is a partial cross-sectional view which shows that on basis of FIG. 12a, a first through-hole is formed while the first interlayer insulating layer, the first gate insulating layer, and the buffer layer are removed in the region where the second thin film transistor will be located;

FIG. 14b-FIG. 14c are partial cross-sectional views which shows that by use of two photolithography processes, a second through-hole is formed by in the lead region, and the first interlayer insulating layer, the first gate insulating layer, and the buffer layer is removed in there region where the second thin film transistor will be located, on basis of FIG. 14a;

REFERENCE MARKS

Figure 1:
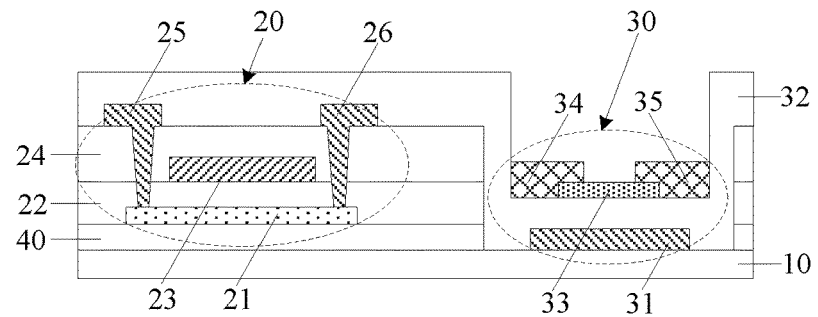
FIG. 1 is a partial cross-sectional view of an array substrate according to some embodiments of the present disclosure.

10—substrate; 20—first thin film transistor; 21—polysilicon active layer; 22—first gate insulating layer; 23—first gate electrode; 24—first interlayer insulating layer; 25—first source electrode; 26—first drain electrode; 27—lower electrode of capacitor; 28—insulating layer of capacitor; 29—upper electrode of capacitor; 30—second thin film transistor; 31—second gate electrode; 32—second gate insulating layer; 33—oxide active layer; 34—second source electrode; 35—second drain electrode; 40—buffer layer; 50—second through-hole; 61—first organic layer; 62—second organic layer; 70—conductive layer.

DETAILED DESCRIPTION OF ILLUSTRATIVE EMBODIMENTS

The technical solutions in the embodiments of the present disclosure will be described below in detail with reference to the accompanying drawings. It is obvious that the described embodiments are only parts of the embodiments of the present disclosure, and not for enumerate all possible embodiments. All other embodiments which can be obviously obtained by a person of ordinary skill in the art based on the embodiments disclosed in the present disclosure without inventive steps are intended to be embraced within the scope of the present disclosure.

According to some embodiments of the present disclosure, there is provided an array substrate. As shown in FIGS. 1-4, the array substrate comprises: a first thin film transistor 20 and a second thin film transistor 30 disposed over a substrate 10. The first thin film transistor 20 and the second thin film transistor 30 are juxtaposed over the substrate 10. The first thin film transistor 20 comprises a portion (i.e., first portion) of the first insulating layer. Here, the first insulating layer may include the insulating layer 22 and/or the insulating layer 24. The first insulating layer comprises a first recess 1401 corresponding to the second thin film transistor 30 (as can be best seen in FIGS. 14c and 14d). The second thin film transistor 30 is located in the first recess. A portion (i.e., second portion) of the first insulating layer which is below the bottom of the first recess has a thickness smaller than the thickness of the first portion of the first insulating layer. It should be understood that the array substrates according to various embodiments are illustrated in FIGS. 1-4, respectively, in which the respective configurations and arrangements of the first thin film transistor 20 and the second thin film transistor 30 may be different.

It should be noted that the first thin film transistor 20 and the second thin film transistor 30 are located on the same side of the substrate 10. The first thin film transistor 20 and the second thin film transistor 30 can be different types of thin film transistors.

For the first thin film transistor 20, one or more of the insulating film(s) or layer(s) therein can be regarded as the first insulating layer according to various different embodiments. The first insulating layer may be formed over the substrate 10, and in a region where pattern(s) is required to form, the corresponding film layer(s) can be etched to form, for example, a recess, a through-hole, or the like.

The second thin film transistor 30 comprises a second gate electrode, a second source electrode, and a second drain electrode. Herein, terms such as "the region where a transistor is located" or the like are sometimes used, and such a term is intended to refer to the space in which all or part of the transistor is located, as appropriate. For example, the region where the second thin film transistor 30 is located may include a region where the second gate electrode, the second source, the second source electrode, the second drain, and the second drain electrode are located, and may also include a region where the channel of the transistor 30 is located.

It should be noted that the thickness of the first insulating layer below the bottom of the first recess may be 0 micrometers, or more. FIGS. 1 to 4 schematically illustrate the embodiments in which the thickness of the first insulating layer below the bottom of the first recess is 0 μm. That is, in the embodiments shown in FIGS. 1-4, the first recess penetrates the first insulating layer such that a component under the first insulating layer, such as a substrate or other layers such as a buffer layer on a substrate, is exposed. In some embodiments, the thickness of the first insulating layer below the bottom of the first recess is set to 0 μm, in order to avoid such a case that when the thickness of the first insulating layer below the bottom of the first recess is otherwise not 0 micrometers, the process control is not satisfactory so that the uniformity of the first insulating layer remained after etching a portion of the thickness of the first insulating layer is poor.

It can be readily understood that each film layer of the second thin film transistor 30 can be formed in order from the bottom of the first recess.

Conventionally, when the first thin film transistor 20 and the second thin film transistor 30 are combined together, as compared with the case where the first thin film transistor 20 or the second thin film transistor 30 is separately formed, the second thin film transistor 30 may be affected by the uniformity performance of the film(s) of the first thin film transistor 20 which is formed first, thus the performance of the second thin film transistor 30 to be fabricated may be affected. According to the embodiments of the present disclosure, the surface of the recess in which the region of the second thin film transistor 30 is to be formed can be made flat. Therefore, when forming the second thin film transistor 30, particularly when forming an insulating layer (such as a gate insulating layer) of the second thin film transistor 30, the uniformity of the insulating layer in the region of the second thin film transistor 30 can be improved, thereby the performance of the second thin film transistor 30 can be improved.

Figure 5:
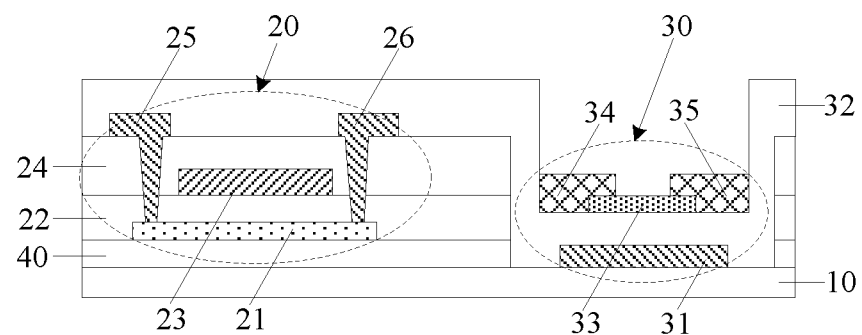
FIG. 5 is a partial cross-sectional view of an array substrate according to some embodiments of the present disclosure.

Optionally, as shown in FIG. 5, a buffer layer 40 is further provided on the surface of the substrate 10, and the first thin film transistor 20 can be disposed over the buffer layer 40. In this case, a region of the buffer layer 40 corresponding to the second thin film transistor 30 comprises a second recess 1403, and the first recess and the second recess are stacked. In some embodiments, the thickness of the buffer layer 40 under the bottom of the second recess is smaller than the thickness of a region of the buffer layer 40 where the first thin film transistor 20 is located.

It should be noted that, in some embodiments, the first recess and the second recess are stacked, and their orthogonal projections on the substrate 10 overlap. The second thin film transistor 30 is located in the first recess and the second recess. That is, the films or layers of the second thin film transistor 30 can be formed in order from the bottom of the recess 1405 which is composed of both the first recess and the second recess.

In some embodiments, the thickness of the first insulating layer below the bottom of the first recess is 0 micrometers; the thickness of the buffer layer 40 below the bottom of the second recess is 0 micrometers. That is, the second thin film transistor 30 is directly formed over the substrate 10.

When the array substrate comprises the buffer layer 40, the first insulating layer and the buffer layer 40 are removed in the region where the second thin film transistor 30 is located, so that the second thin film transistor 30 can be formed from the substrate 10, thus the uniformity of the insulating layer of the second thin film transistor 30 can be further improved.

In some embodiments, the active layers of the first thin film transistor 20 and the second thin film transistor 30 may be formed of the same or different semiconductor materials. For example, the first thin film transistor 20 and the second thin film transistor 30 may be a polysilicon thin film transistor and an oxide semiconductor thin film transistor (also referred to herein as an oxide thin film transistor), respectively. It should be understood that the present disclosure shall not be limited thereto.

Figure 2:
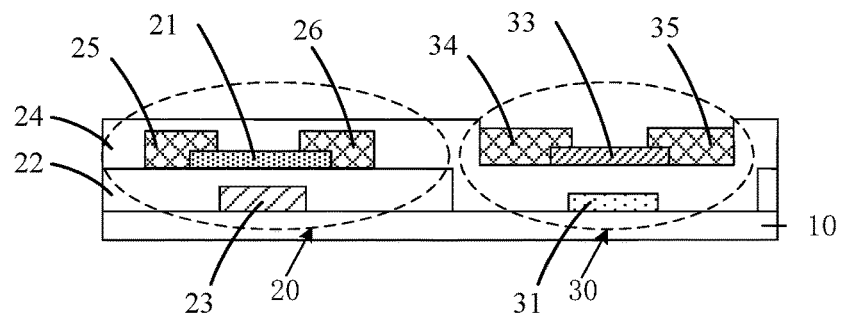
FIG. 2 is a partial cross-sectional view of an array substrate according to some embodiments of the present disclosure.
Figure 3:
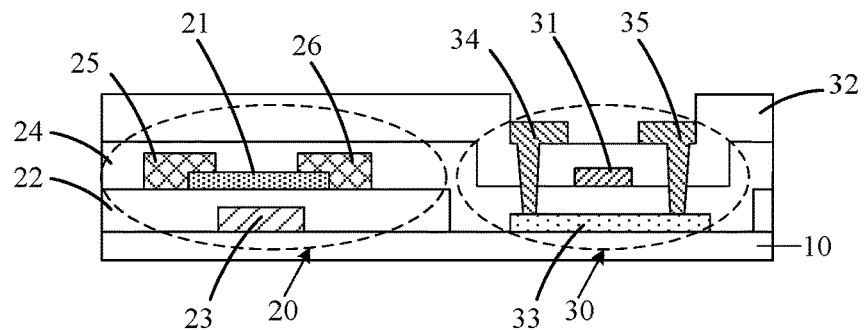
FIG. 3 is a partial cross-sectional view of an array substrate according to some embodiments of the present disclosure.
Figure 4:
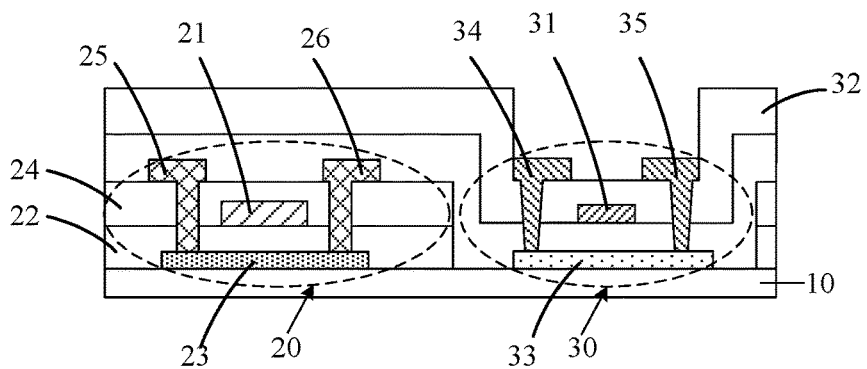
FIG. 4 is a partial cross-sectional view of an array substrate according to some embodiments of the present disclosure.

In some specific embodiments, the first thin film transistor 20 can be a polysilicon thin film transistor. In this case, the first thin film transistor 20 may be of a top gate type structure (as shown in FIGS. 1 and 4) or a bottom gate type structure (as shown in FIGS. 2 and 3).

The second thin film transistor 30 may be an oxide thin film transistor. In this case, the second thin film transistor 30 may be of a bottom gate type structure (as shown in FIGS. 1 and 2) or a top gate type structure (as shown in FIGS. 3 and 4).

Those skilled in the art will readily understand that polysilicon thin film transistors have the advantages of high mobility and fast charging, meanwhile oxide thin film transistors have the advantage of low leakage current.

In some embodiments, as shown in FIG. 5, the first thin film transistor 20 is a top gate type thin film transistor. According to various embodiments, the first insulating layer may comprise a first gate insulating layer 22 and/or a first interlayer insulating layer 24.

When the first insulating layer comprises the first gate insulating layer 22 and the first interlayer insulating layer 24, the thickness of the first insulating layer is relative thick, and the surface uniformity of the first insulating layer may be relatively poor. Thus, when the second thin film transistor 30 is formed directly on the first insulating layer including the first gate insulating layer 22 and the first interlayer insulating layer 24, the second thin film transistor 30 may be prone to encounter such a problem of poor uniformity of the insulating layer(s) thereof.

In some embodiments, as shown in FIG. 5, the first thin film transistor 20 further comprises a first source electrode 25 and a first drain electrode 26. The second thin film transistor 30 comprises a second gate electrode 31, a second source electrode 34, and a second drain electrodes 35. In some embodiments, the second gate electrode 31, or the second source electrode 34 and the second drain electrode 35, may be disposed in same layer(s) as the first source electrode 25 and the first drain electrode 26 are disposed. In some embodiments, the second gate electrode 31, or the second source electrode 34 and the second drain electrode 35, may be formed of the same layer as the first source electrode 25 and the first drain electrode 26 are formed. For example, in the embodiment shown in FIG. 5, the second gate electrode 31 and the first source electrode 25 and the first drain electrode 26 may be formed of the same layer. In some embodiments, the electrodes disposed in the same layer may be formed by a same patterning process.

According to the embodiments of the present disclosure, the second gate electrode 31, or the second source electrode 34 and the second drain electrode 35, may be formed in synchronization with the first source electrode 25 and the first drain electrode 26, which simplifies the process.

Considering that the process temperature required for fabricating the polysilicon active layer of the polysilicon thin film transistor is high, and the process temperature required for each layer of the oxide thin film transistor is relatively low, the active region of the first thin film transistor 20 can be configured as a polysilicon active region, that is, the first thin film transistor 20 is set as a polysilicon thin film transistor, in order to avoid such a case that the oxide thin film crystal which is formed first may be affected by the subsequent fabrication of the process temperature of the polysilicon active layer.

On this basis, as shown in FIG. 5, the first thin film transistor 20 may specifically include a polysilicon active layer 21, a first gate electrode 23, a first source electrode 25, and a first drain electrode 26. The polysilicon active layer 21 is disposed between the substrate 10 and the first gate insulating layer 22. The first gate electrode 23 is disposed between the first gate insulating layer 22 and the first interlayer insulating layer 24. The first source electrode 25 and the first drain electrode 26 is disposed on a side of the first interlayer insulating layer 24 which is away from the substrate 10. The first source electrode 25 and the first drain electrode 26 are in contact with the polysilicon active layer 21, respectively, through contacts in the first through-holes which penetrate through the first interlayer insulating layer 24 and the first gate insulating layer 22. In some cases, the contract can be deemed as a part of the related electrode when appropriate.

In some embodiments, to prevent harmful impurities, ions, etc. in the substrate 10 from being diffused into the polysilicon active layer 21, a buffer layer 40 is disposed between the substrate 10 and the polysilicon active layer 21. The buffer layer 40 may be formed of an insulating material.

Figure 6:
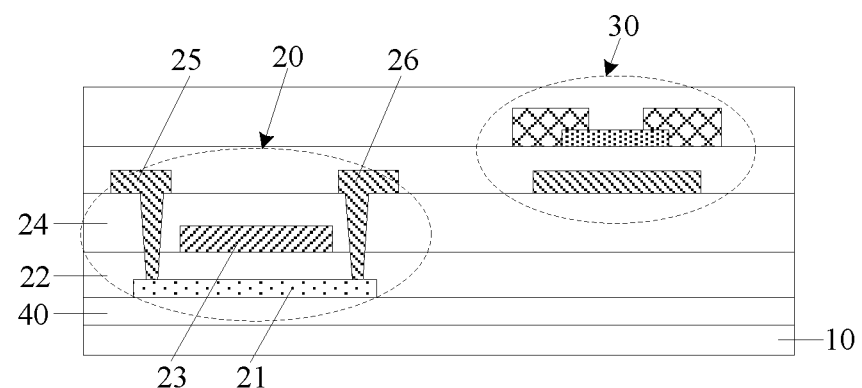
FIG. 6 is a partial cross-sectional view of an array substrate according to some embodiments of the present disclosure, wherein a second thin film transistor is directly formed over a substrate over which a first thin film transistor is formed.

In some cases, the total thickness of the buffer layer 40, the first gate insulating layer 22, and the first interlayer insulating layer 24 may be large, for example, may exceed 10,000 Å. Any one of the buffer layer 40, the first gate insulating layer 22, and the first interlayer insulating layer 24 may be a single layer structure or a double layer or a multilayer composite structure. Therefore, even the film thickness uniformity is acceptable when forming a film/layer with a single layer structure, but under the influence of the stack of the multilayer films/layers with high thickness, the surface of the first interlayer insulating layer 24 may be uneven, and the uniformity is relatively poor. If the second thin film transistor 30 which may be oxide thin film transistor is directly formed over such a first interlayer insulating layer 24 (as shown in FIG. 6), a problem of poor uniformity regarding the insulating layer of the oxide thin film transistor (for example, the gate insulating layer) may occur. When such a problem occurs in the second gate insulating layer of the oxide thin film transistor, the uniformity of the threshold voltage (Vth) of the oxide thin film transistor may be directly affected, thereby affecting the display performance of the display product.

Based on this, after the first gate insulating layer 22 and the first interlayer insulating layer 24 of the polysilicon thin film transistor are completed, the first gate insulating layer 22 and the first interlayer insulating layer 24 in the region corresponding to the oxide thin film transistor can be partly removed or completely removed. Thereafter, oxide thin film transistor can be formed on the first insulating layer (e.g., the first gate insulating layer 22 and the first interlayer insulating layer 24) at least a portion of which is removed or on the film/layer (e.g., the substrate 10) exposed after the first insulating layer is completely removed in the region corresponding to the oxide thin film transistor, thus the uniformity of the film/layer of the oxide thin film transistor can be improved.

It should be noted that, in many cases, the first source electrode 25 and the first drain electrode 26 are interchangeable, for example, the first source electrode 25 and the first drain electrode 26 of the first thin film transistor 20 may be symmetrical. Based on this, in order to distinguish the two electrodes of the first thin film transistor 20 except the first gate electrode 23, one of the electrodes is referred to as a first source electrode 25 and the other electrode is referred to as a first drain electrode 26.

As shown in FIG. 5, the second thin film transistor may comprise a second gate electrode 31, a second gate insulating layer 32, an oxide active layer 33, a second source electrode 34, and a second drain electrode 35.

The second gate electrode 31, or the second source electrode 34 and the second drain electrode 35, are disposed in the same layer(s) as the first source electrode 25 and the first drain electrode 26. The second gate insulating layer 32 may cover the first source electrode 25 and the first drain electrode 26. That is, the second gate insulating layer 32 also serves as a protective layer of the first thin film transistor 20 at this time.

It should be noted that FIG. 5 illustrates an example in which the second thin film transistor 30 is a bottom gate type oxide thin film transistor. In other embodiments, the second thin film transistor 30 may also be of a top gate type.

In addition, the second source electrode 34 and the second drain electrode 35 of the second thin film transistor 30 may also be interchangeable, for example, the second source electrode 34 and the second drain electrode 35 may be symmetrical. Based on this, in order to distinguish the two electrodes of the second thin film transistor 30 except the second gate electrode 31, one of the electrodes is referred to as a second source electrode 34, and the other electrode is referred to as a second drain electrode 35.

Figure 7:
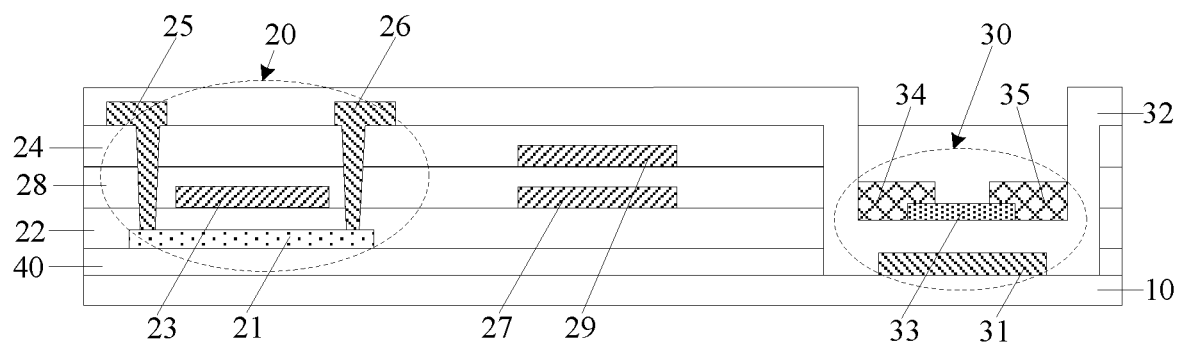
FIG. 7 is a partial cross-sectional view of an array substrate according to some embodiments of the present disclosure.

Optionally, the first insulating layer may further include an additional insulating layer. As shown in FIG. 7, in addition to the first gate insulating layer 22 and the first interlayer insulating layer 24, the first insulating layer further comprises a insulation layer 28*a* for a capacitor, which is interposed between the first gate insulating layer 22 and a first interlayer insulating layer 24. The lower electrode 27 of the capacitor is in the same layer as the first gate electrode 23 and is disposed between the capacitor insulating layer 28 and the first gate insulating layer 22. The upper electrode 29 of the capacitor is disposed opposite to the capacitor lower electrode 27, and the capacitor upper electrode 29 is disposed between the capacitor insulating layer 28 and the first interlayer insulating layer 24.

The capacitor upper electrode 29, the capacitor lower electrode 27, and the capacitor insulating layer therebetween constitute the capacitor. By adjusting the thickness of the capacitive insulating layer 28, a desired capacitance value can be obtained. Thus, the capacitor can be used to supply a storage voltage to a pixel driving circuit, and can also be used to compensate the threshold voltage Vth of a driving transistor in the pixel driving circuit.

Figure 8:
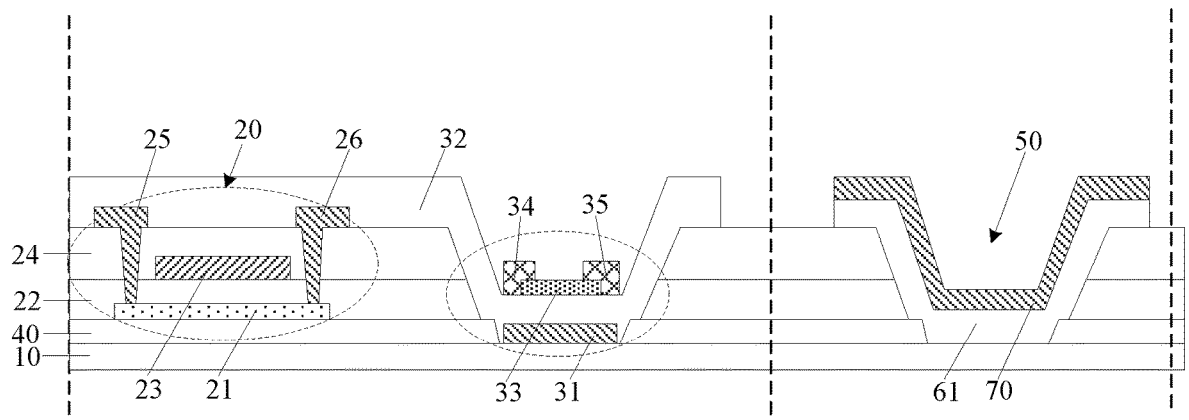
FIG. 8 is a partial cross-sectional view of an array substrate according to some embodiments of the present disclosure.
Figure 9:
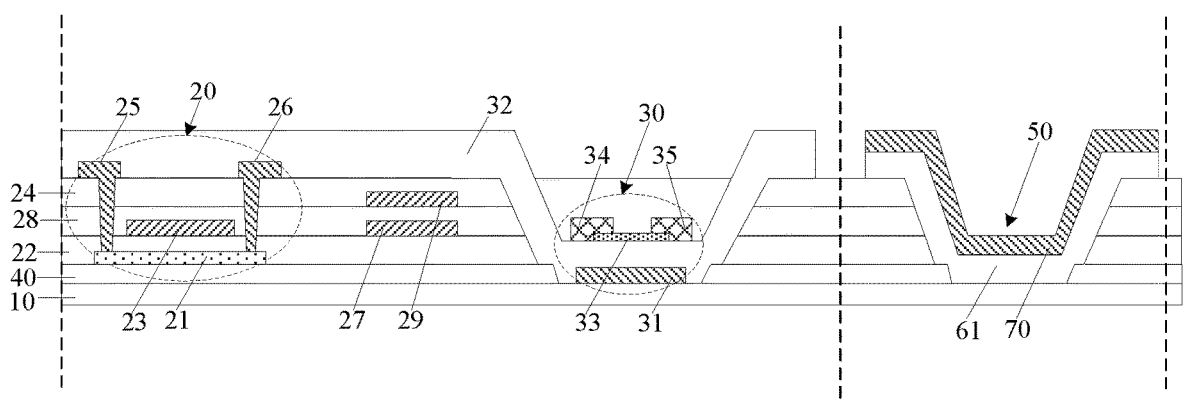
FIG. 9 is a partial cross-sectional view of an array substrate according to some embodiments of the present disclosure.

In some embodiments, the array substrate further has a lead region. The lead region may include a second through-hole. In some embodiments, as shown in FIGS. 8 and 9, the sidewalls of the second through-hole 50 are stepped. For example, the second through-hole 50 can include a first sub-through-hole 501 (FIG. 14*b*) and a second sub-through-hole 503 which are stacked (FIG. 14*c*). The second sub-through-hole is disposed adjacent to the substrate 10, and the aperture of the second sub-through-hole is smaller than the aperture of the first sub-through-hole.

In some embodiments, as shown in FIGS. 8 and 9, the first recess is disposed in the same layer(s) as the first sub-though-hole; the second recess is disposed in the same layer(s) as the second sub-though-hole.

Referring to FIGS. 8 and 9, the first sub-through-hole may penetrate the first interlayer insulating layer 24 and the first gate insulating layer 22, and the second sub-through-hole may penetrate the buffer layer 40. The first recess may penetrate the first interlayer insulating layer 24 and the first gate insulating layer 22, and the second recess may penetrate the buffer layer 40. Correspondingly, the thickness of the first insulating layer below the bottom of the first recess is 0 micrometers, and the thickness of the buffer layer 40 below the bottom of the second recess is 0 micrometers.

The first recess is disposed in the same layers as the first sub-though-hole, and in other words, the first recess and the first sub-through-hole are formed by the same (e.g., one-time) patterning process. The second recess is disposed in the same layers as the second sub-through-hole, and in other words, the second recess and the second sub-through-hole are formed by the same (e.g., one) patterning process. The side wall of the second through-hole may be configured in a step shape. Similarly, the side wall of the recess 1405 formed collectively by the first recess and the second recess may also be configured in a stepped shape.

In some embodiments, substrate 10 is a flexible substrate. The substrate 10 may be a multi-layered structure, for example, a laminated structure including an organic material layer, an inorganic material layer, and an organic material layer. The organic layer material of the substrate 10 may be at least one selected from a group including polyimide, polycarbonate, polyacrylate, and polyetherimide. The inorganic layer of the substrate 10 may be selected from inorganic materials having a good ability to block moisture, oxygen, or the like.

When the substrate 10 is a flexible substrate, the array substrate is a flexible array substrate. The display device to which such a kind of the array substrate is applied can have a function of being bendable, thereby meeting various market demands.

Further, as shown in FIGS. 8 and 9, a first organic layer 61 is further provided at the second through-hole 50. A conductive layer 70 is also disposed at the second through-hole 50. The first organic layer 61 is located on a side of the conductive layer 70 which is close to the substrate 10. The first organic layer 61 may be configured to at least cover a sidewall and a bottom surface of the second through-hole 50. In the embodiments shown in FIGS. 8 and 9, the second through-hole 50 exposes a portion of the substrate 10, and the first organic layer 61 covers the exposed portion of the substrate 10. The conductive layer 70 may comprise leads, such as leads for IC drive signals, and the like. When the array substrate is a flexible substrate, the lead region can serve as a bending region.

The first organic layer 61 is provided at the second through-hole 50 to cover the second through-hole 50, and this can improve the bending ability of the array substrate and reduce damage on the array substrate due to stress when the array substrate is bent. In particular, the conductive layer 70 at the second through-hole 50 can be prevented from being broken due to the bending stress. In this way, the reliability and lifetime of the substrate and the display device are improved.

Figure 10:
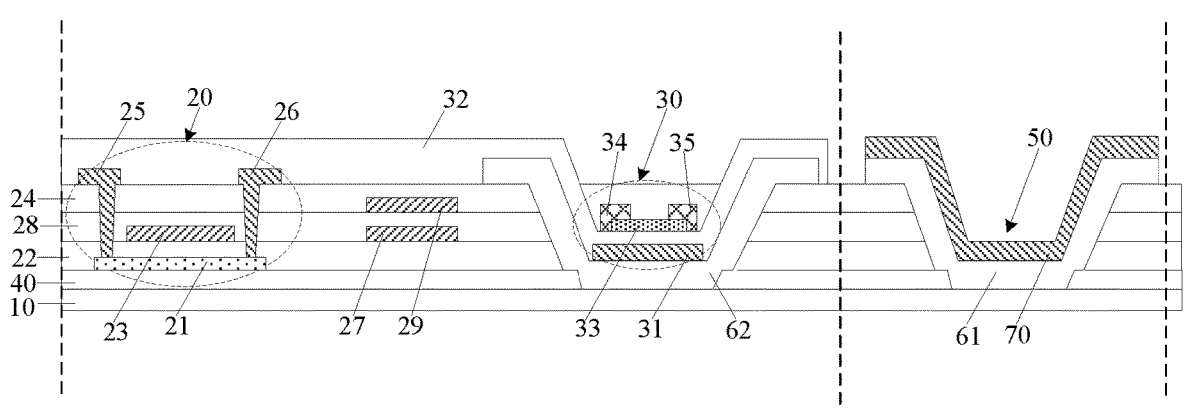
FIG. 10 is a partial cross-sectional view of an array substrate according to some embodiments of the present disclosure.

Further optionally, as shown in FIG. 10, the array substrate may further include a second organic layer 62. The second organic layer 62 may be disposed at a region where the second thin film transistor 30 is located. The second thin film transistor 30 is disposed over the second organic layer 62.

In some embodiments, the second organic layer 62 is disposed in the same layer as the first organic layer 61. For example, when forming the first organic layer 61, the organic layer at the recess 1405 may be remained to form the second organic layer 62. Thereafter, the second thin film transistor 30 is formed over the second organic layer 62.

In an alternative embodiment, the organic layer at the recess may be etched away when forming the first organic layer 61, so that there is no organic layer under the second thin film transistor 30 which is to be formed later (refer to FIG. 8 and FIG. 9).

As shown in FIG. 10, the second organic layer 62 is formed to cover the sidewalls of the recess 1405 (FIG. 14*c*) and the bottom surface of the recess 1405 (i.e., the surface of the substrate 10 exposed by the recess 1405). In the embodiment shown in the figure, the second thin film transistor 30 is of a bottom gate type structure, and its gate electrode 31 is formed over the organic insulating layer 62. A portion of the insulating layer 32 is formed over the gate electrode 31 of the second transistor 30 and a portion of the second organic insulating layer 62. A portion of the insulating layer 32 serves as a gate insulating layer of the second transistor 30.

When the second organic layer 62 is disposed in a region where the second thin film transistor 30 is located, the second organic layer 62 has a planarization effect, thereby causing the uniformity of the film/layers of the second thin film transistor 30 (for example, a gate insulating layer, a channel region film) is further improved. Further, the second organic layer 62 may be disposed in the same layer as the first organic layer 61 and thus the number of patterning processes is not increased.

According to an embodiment of the present disclosure, there is further provided a display panel including the array substrate according to any of the embodiments of the present disclosure.

The display panel can be, for example, an OLED display panel. The above-described first thin film transistors 20 and second thin film transistors 30 can be used for a pixel driving circuit therein.

According to an embodiment of the present disclosure, there is further provided a method for fabricating an array substrate, as shown in FIGS. 1-4, comprising: forming a first thin film transistor 20 and a second thin film transistor 30 over a substrate 10; the first thin film transistor 20 comprising a first insulating layer; wherein, before forming the second thin film transistor 30, at least a portion of the thickness of the first insulating layer is removed to form a first recess in a region corresponding to the second thin film transistor 30.

According to further embodiments of the present disclosure, a method of fabricating an array substrate is provided, comprising: providing a substrate structure. As shown in FIG. 12a, the substrate structure comprises a substrate 10, and at least a portion of a first thin film transistor and a first insulating layer over the substrate. As a non-limiting example, said at least a portion of the first thin film transistor may include, for example, an active layer 21, a gate electrode 23, a gate insulating layer 22, and an insulating layer 24. The first thin film transistor comprises at least a portion of the first insulating layer. As previously mentioned, the first insulating layer can include a gate insulating layer 22 and/or an insulating layer 24. In some embodiments, the substrate structure may also include an optional buffer layer 40. In some embodiments, the method may further include: forming a buffer layer over the substrate before forming the first thin film transistor.

The preparation method further comprises: removing at least a portion of a thickness of a region of the first insulating layer, which region is corresponding to the second thin film transistor, to form a first recess 1205, as shown in FIG. 12b. Optionally, first through-holes 1201 and 1203 that reach the active layer 21 through the insulating layers 22 and 24 may be formed simultaneously with, before or after this step. It should also be noted that where the substrate structure further comprises a buffer layer 40, the first recess 1205 can be set to also penetrate the buffer layer 40. As such, as shown in FIG. 12b, the first recess 1205 exposes a portion of the substrate 10.

The method further comprises: forming a second thin film transistor in the first recess. This second thin film transistor may be the second thin film transistor as shown in any of the examples of FIGS. 1-5, 7-10, and the like. Those skilled in the art can readily appreciate the various processes used to form the second thin film transistor in accordance with the teachings of the examples of FIGS. 1-5, 7-10, etc. of the present application. Therefore, a detailed description thereof will be omitted herein. An exemplary process for forming the second thin film transistor will be further described later with reference to subsequent figures.

According to the methods for fabricating an array substrate of the embodiments of the present disclosure, the surface of the recess in the region where the second thin film transistor is to be formed can be made flat, thereby when forming the second thin film transistor 30, in particular, when forming the second gate insulating layer 32 of the second thin film transistor 30, the uniformity of the second gate insulating layer 32 in the region of the second thin film transistor 30 can be improved, thereby improving the performance of the second thin film transistor 30.

Optionally, as shown in FIG. 5, before the forming of the first thin film transistor 20 and the second thin film transistor 30, the preparation method further comprises: forming a buffer layer 40. On this basis, in the region corresponding to the second thin film transistor 30, at least a part of the thickness of the buffer layer 40 is removed to form a second recess. In other words, at least a portion of the thickness of the region of the buffer layer corresponding to the second thin film transistor is removed to form a second recess.

In some embodiments, the thickness of the first insulating layer below the bottom of the first recess is 0 micrometers; the thickness of the buffer layer 40 below the bottom of the second recess is 0 micrometers.

The buffer layer 40 may be a one-layer structure or a multi-layer structure. For example, when the buffer layer 40 is a one-layer structure, the material thereof may be, for example, silicon oxide (SiOx) or silicon nitride (SiNx). When the buffer layer 40 is a structure with two or more layers, it may be a composite film/layer of silicon oxide layer(s) and silicon nitride layer(s).

When the array substrate comprises the buffer layer 40, the first insulating layer and the buffer layer 40 are removed in the region where the second thin film transistor 30 is located, so that the second thin film transistor 30 can be formed from the substrate 10, thus the uniformity of the insulating layer(s) of the second thin film transistor 30 cam be further improved.

In some embodiments, the first thin film transistor 20 and the second thin film transistor 30 are respectively a polysilicon thin film transistor and an oxide thin film transistor.

Specifically, the first thin film transistor 20 may be a polysilicon thin film transistor. In this case, the first thin film transistor 20 may be a top gate type structure (as shown in FIG. 1 and FIG. 4) or a bottom gate type structure (such as FIG. 2 and FIG. 3).

The second thin film transistor 30 may be an oxide thin film transistor. In this case, the second thin film transistor 30 may be of a bottom gate type structure (as shown in FIGS. 1 and 2) or a top gate type structure (as shown in FIGS. 3 and 4).

In some embodiments, the first thin film transistor 20 is a polysilicon thin film transistor and the second thin film transistor 30 is an oxide thin film transistor.

In some embodiments, as shown in FIG. 5, the first thin film transistor 20 is a top gate type thin film transistor. The top gate type thin film transistor may include a first gate insulating layer 22 and/or a first interlayer insulating layer 24. The first insulating layer may include a first gate insulating layer 22 and/or a first interlayer insulating layer 24.

When the first thin film transistor 20 is a top gate type polysilicon thin film transistor, and the first insulating layer comprises the first gate insulating layer 22 and the first interlayer insulating layer 24, the first insulating layer is relatively thick, and the surface of the first insulating layer may have a problem of unevenness and relatively poor uniformity. Thus, when the second thin film transistor 30 is formed directly on the first insulating layer including the first gate insulating layer 22 and the first interlayer insulating layer 24, the films/layers of the second thin film transistor 30 (for example, a gate insulating layer) may be easily caused a problem of poor uniformity. In contrast, this problem can be alleviated or overcome in accordance with embodiments of the present disclosure.

In addition, in order to simplify the process, the second gate electrode 31 of the second thin film transistor 30, or the second source electrode 34 and the second drain electrode 35, and the first source electrode 25 and the first drain electrode 26 of the first thin film transistor 20 may be formed by the same (e.g., the same one) patterning process.

Similarly, in order to simplify the patterning process, the first recess, or the first recess and the second recess, may be formed with the same (e.g., the same one) patterning process as the first through-hole in the first thin film transistor 20 is formed. And the contacts formed in the first through-holes may be used to bring the first source electrode and the first drain electrode of the first thin film transistor 20 into contact with the first active layer, respectively.

In some embodiments, forming the first thin film transistor 20 and the second thin film transistor 30, includes the following steps, as shown in FIG. 11:

In step S10, as shown in FIG. 12a, a polysilicon active layer 21 (i.e., the first active layer), a first gate insulating layer 22, a first gate electrode 23, and a first interlayer insulating layer 24 of the first thin film transistor 20 are sequentially formed over the substrate 10 having the buffer layer 40 formed thereon. The first insulating layer comprises the first gate insulating layer 22 and the first interlayer insulating layer 24.

The polysilicon active layer 21 can be formed by: forming an amorphous silicon film over the substrate 10 over which the buffer layer 40 is formed, and then forming an amorphous silicon layer in the active layer region by a photolithography and etching process, and thereafter performing a dehydrogenation process on the amorphous silicon layer with, for example, a high temperature oven, so as to prevent hydrogen explosion during crystallization and to reduce the density of defects in the crystallized layer. After the dehydrogenation process, a low temperature poly-Silicon (LTPS) formation process is performed, in which a crystallization process such as a enhanced laser annealing (ELA) process, a metal induced crystallization (MIC) process, or a solid phase crystallization (SPC) process can be used to crystallize the amorphous silicon layer to form the polysilicon active layer 21.

Alternatively, the amorphous silicon film may be first crystallized to form a polysilicon film, and then the polysilicon active layer 21 can be formed in the active layer region by a photolithography and etching process.

The first gate insulating layer 22 may be a structure having a single layer, two layers, or more than two layers, for example, may be a single layer of silicon oxide, a single layer of silicon nitride, or a laminate of the both. The first gate insulating layer 22 may be formed by a deposition process.

The first interlayer insulating layer 24 may be a structure having a single layer, two layers, or more than two layers, for example, may be a single layer of silicon oxide, a single layer of silicon nitride, or a combination of the both. The first interlayer insulating layer 24 may be formed by a deposition process.

In step S11, as shown in FIG. 12b, first through-hole(s) penetrating through the first interlayer insulating layer 24 and the first gate insulating layer 22 is formed, and meanwhile in the region of the second thin film transistor 30, the first interlayer insulating layer, the first gate insulating layer 22, and the buffer layer 40 are removed to expose a part of the substrate 10.

A dry etching process can be employed to form the first through-hole and expose the substrate 10 in the region of the second thin film transistor 30. A combination of dry etching and wet etching may also be employed to form the first through-hole and expose the substrate 10 in the region of the second thin film transistor 30.

In step S12, referring to FIG. 5, a first source electrode 25 and a first drain electrode 26 are formed, and the first source electrode 25 and the first drain electrode 26 are respectively in contact with the polysilicon active layer 21 through the first through-holes.

In step S13, referring to FIG. 5, a second thin film transistor 30 is formed, wherein the second thin film transistor 30 comprises a second gate electrode 31, a second gate insulating layer 32, an oxide active layer 33, a second source electrode 34, and a second drain electrode 35. The second gate electrode 31, or the second source electrode 34 and the second drain electrode 35, can be formed in synchronization with the first source electrode 25 and the first drain electrode 26. The second gate insulating layer 32 also covers the first source electrode 25 and the first drain electrode 26.

Taking the case where the second thin film transistor 30 is of a bottom gate type as an specific example, for the above steps S12 and S13, the first source electrode 25 and the first drain electrode 26 are formed first, and the second gate electrode 31 is simultaneously formed, and then a second gate insulating layer 32, an oxide active layer 33, and a second source electrode 34 and a second drain electrode 35 are sequentially formed.

The second gate insulating layer 32 also covers the first source electrode 25 and the first drain electrode 26. That is, the second gate insulating layer 32 also serves as a protective layer for the first thin film transistor 20 at this time.

Since the total thickness of the buffer layer 40, the first gate insulating layer 22, and the first interlayer insulating layer 24 may possibly exceed 10,000 Å, and any of the buffer layer 40, the first gate insulating layer 22, and the first interlayer insulating layer 24 may be a one-layer structure or a double-layer or multi-layer composite structure, and therefore, even film thickness uniformity is acceptable when a single-layer film/layer is formed, but under the influence of the superposition of multiple layers of a relatively high thickness, the surface of the first interlayer insulating layer 24 may have a problem of unevenness and relatively poor uniformity. If the second thin film transistor 30 (e.g., the oxide thin film transistor) is directly formed over the first interlayer insulating layer 24 (as shown in FIG. 6), the uniformity of the second gate insulating layer 32 of the oxide thin film transistor my be poor. And, when such a problem occurs in the second gate insulating layer 32 of the oxide thin film transistor, it will directly affect the uniformity of the threshold voltage (Vth) of the oxide thin film transistors, thereby affecting the display performance of the display product.

Based on this, after the first gate insulating layer 22 and the first interlayer insulating layer 24 of the polysilicon thin film transistor are formed, the first interlayer insulating layer 24, the first gate insulating layer 22, and the buffer layer 40 are removed in the region of oxide thin film transistor region, and then, the oxide thin film transistor is formed. Thus, the oxide thin film transistor is directly formed over the substrate 10 to prevent the uniformity of the films/layers of the oxide thin film transistor from being affected by the first gate insulating layer 22 and the first interlayer insulating layer 24. In addition, according to the embodiments of the present disclosure, the second gate electrode 31, or the second source electrode 34 and the second drain electrode 35, can be formed in synchronization with the first source electrode 25 and the first drain electrode 26, which simplifies the process flow.

In some embodiments, as shown in FIG. 8 and FIG. 9, the preparing method further comprises: forming a second through-hole 50 in a lead region of the array substrate, and a conductive layer 70 at the second through-hole 50. The sidewall of the second through-hole 50 has a stepped structure, that is, the second through-hole 50 comprises a first sub-through-hole and a second sub-through-hole which are stacked, the second sub-through-hole is adjacent to the substrate 10, and the aperture of the second sub-through-hole is smaller than the aperture of the first sub-through-hole.

The conductive layer 70 comprises leads, such as leads for IC driving signals, and the like.

It should be noted that with the sidewall of the second through-hole 50 being formed as a stepped structure, and the aperture of the second sub-through-hole being smaller than the aperture of the first sub-through-hole, following problems can be avoided: the slope of the second through-hole 50 in the lead region is formed too large, the diameter of the lower surface of the second through-hole 50 is larger than the diameter of the upper surface thereof, and thereby the conductive layer located at the second through-hole 50 is prone to be broken.

Further, as shown in FIG. 8 and FIG. 9, the preparation method further comprises: forming a first organic layer 61 at the second through-hole 50, the first organic layer 61 being located on a side of the conductive layer 70 which is near the substrate 10, and the first organic layer 61 covering the second through-hole 50.

Alternatively, as shown in FIG. 10, the preparation method further comprises: forming the first organic layer 61 and the second organic layer 62 by a same patterning process. The first organic layer 61 is located on a side of the conductive layer 70 which near the substrate 10, and the organic layer 61 covers the second through-hole 50. The second organic layer 62 is formed in a region of the second thin film transistor 30, and the second thin film transistor 30 is to be formed over the second organic layer 62.

The substrate 10 can be a flexible substrate. The substrate 10 may be a multilayer structure such as a laminate structure including an organic layer, an inorganic layer, and an organic layer. The organic layer material for the substrate 10 may be at least one selected from a group consisting of polyimide, polycarbonate, polyacrylate, and polyetherimide. For the inorganic layer of the substrate 10, may selectively inorganic materials with good ability to block the impurity such as moisture, hydrogen, oxygen, and the like can be selected.

Providing the first organic layer 61 covering the second through-hole 50 at the second through-hole 50 can improve the bending ability of the array substrate, reduce damage on the array substrate due to stress in bending, and particularly prevent the second conductive layer 70 at the through-hole 50 from being broken due to the bending stress, thus the reliability and lifetime can be improved.

Figure 13:
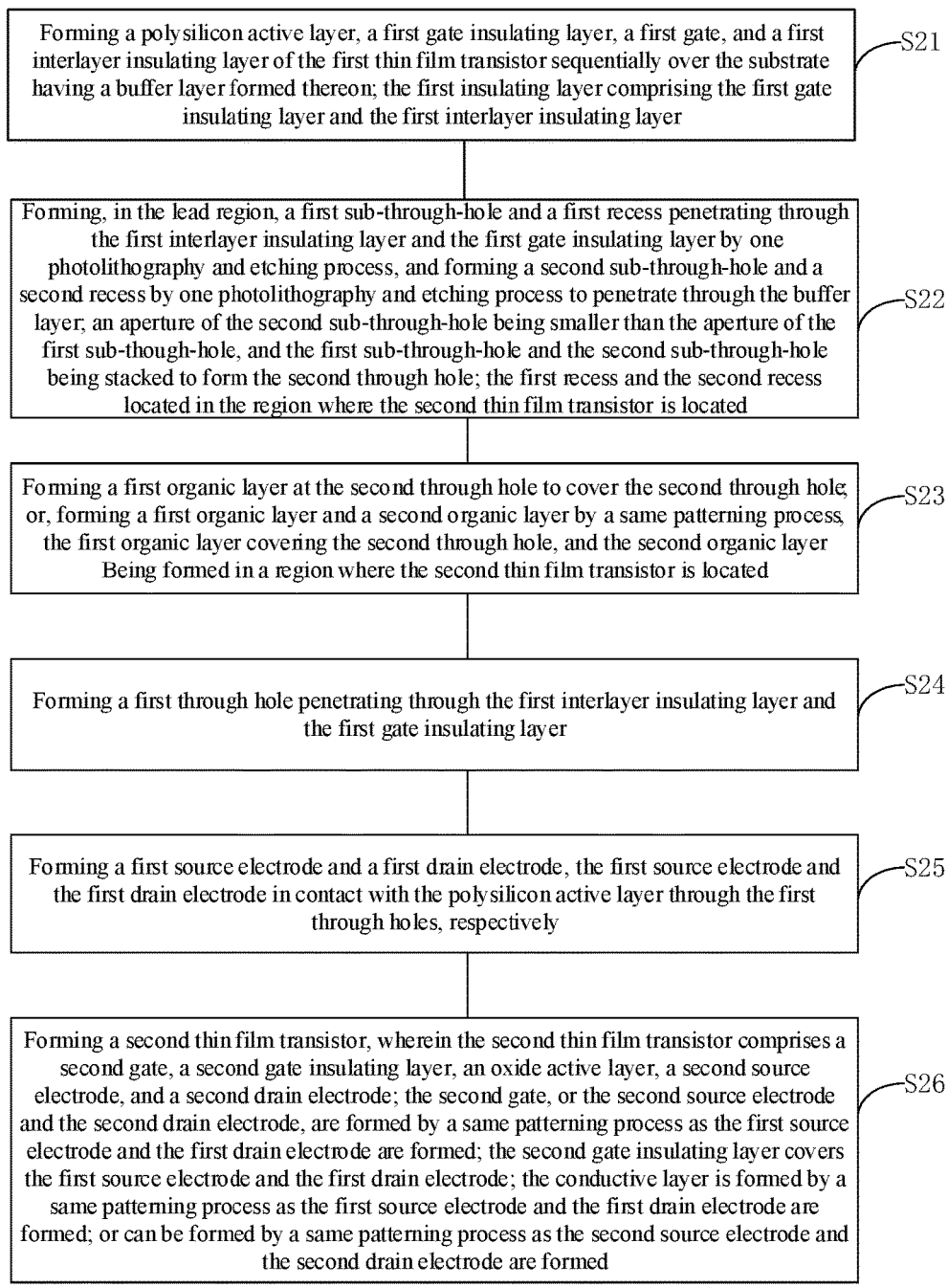
FIG. 13 is a schematic flow chart of preparing a first thin film transistor and a second thin film transistor, a second through-hole, a first organic layer, and a conductive layer according to some embodiments of the present disclosure.
Figure 14A:
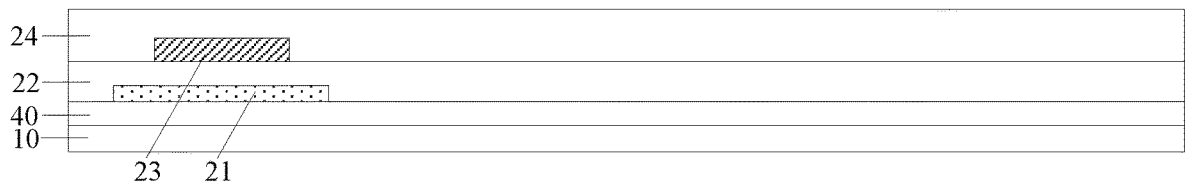
FIG. 14a is a partial cross-sectional view showing that a polysilicon active layer, a first gate insulating layer, a first gate electrode, and a first interlayer insulating layer of a first thin film transistor is sequentially formed over a buffer layer according to some embodiments of the present disclosure.

In some embodiments, as shown in FIGS. 8-10, the first recess and the first sub-through-hole are formed by a same patterning process. The second recess and the second sub-through-hole are formed by a same patterning process. This will not increase the number of patterning processes and simplify the preparation process. Based on this, by way of example, forming the first thin film transistor 20, the second thin film transistor 30, the second through-hole 50, the first organic layer 61 and the conductive layer 70 may include the following steps, as shown in FIG. 13:

In step S21, as shown in FIG. 14a, the polysilicon active layer 21, the first gate insulating layer 22, the first gate electrode 23, and the first interlayer insulating layer 24 of the first thin film transistor 20 are sequentially formed over the substrate 10 having the buffer layer 40 formed thereon. The first insulating layer comprises the first gate insulating layer 22 and the first interlayer insulating layer 24.

Figure 14B:
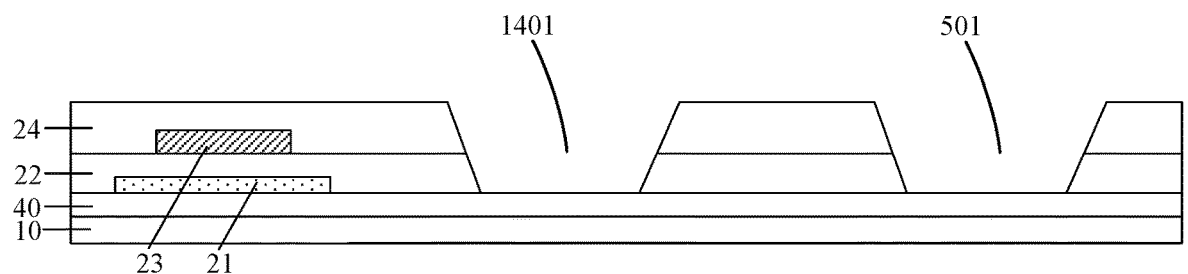
Figure 14C:
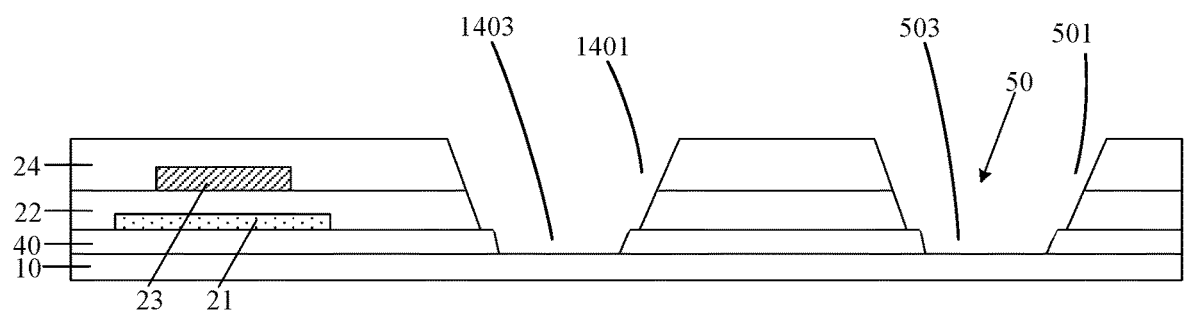

In step S22, as shown in FIG. 14b and FIG. 14c, in the lead region, a first sub-through-hole and a first recess penetrating through the first interlayer insulating layer 24 and the first gate insulating layer 22 are formed by one photolithography and etching process, and a second sub-through-hole and a second recess are formed by one photolithography and etching process to penetrate through the buffer layer 40. The aperture of the second sub-through-hole is smaller than the aperture of the first sub-though-hole, and the first sub-through-hole and the second sub-through-hole are stacked to form the second through-hole. The first recess and the second recess are located in the region of the second thin film transistor 30.

The aperture of the second sub-through-hole is smaller than the aperture of the first sub-through-hole, and the first sub-through-hole and the second sub-through-hole are stacked to form a second through-hole, that is, the sidewall of the second through-hole is a stepped structure. The thickness of the first insulating layer below the bottom of the first recess is 0 micrometers, and the thickness of the buffer layer 40 below the bottom of the second recess is 0 micrometers. It can be understood that when the second through-hole is a stepped structure, the sidewall of the recess formed by the first recess and the second recess, as a whole, also has a recess structure.

Figure 14D:
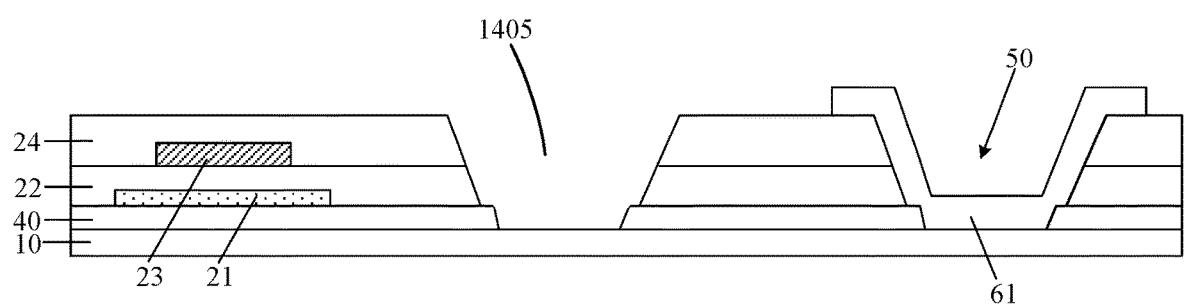
FIG. 14d is a partial cross-sectional view showing the formation of the first organic layer on basis of FIG. 14c.
Figure 14E:
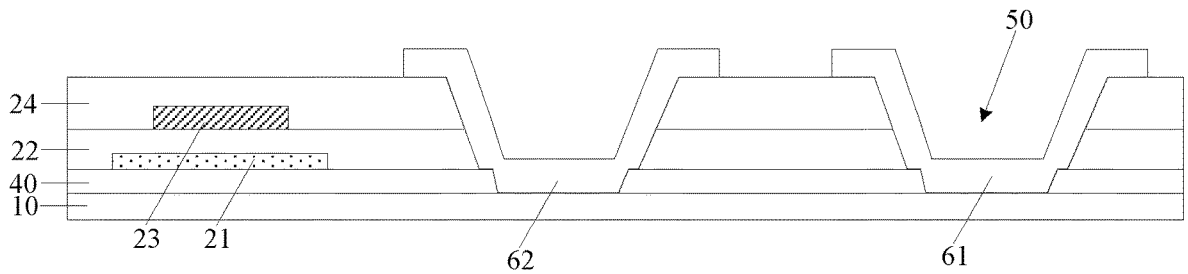
FIG. 14e is a partial cross-sectional view showing the formation of the first organic layer and the second organic layer on basis of FIG. 14c.

In step S23, as shown in FIG. 14d, a first organic layer 61 is formed at the second through-hole 50 to cover the second through-hole 50. Alternatively, as shown in FIG. 14e, a first organic layer 61 and a second organic layer 62 are formed by a same patterning process, and the first organic layer 61 covers the second through-hole 50, and the second organic layer 62 is formed in a region where the second thin film transistor 30 is located.

Figure 14F:
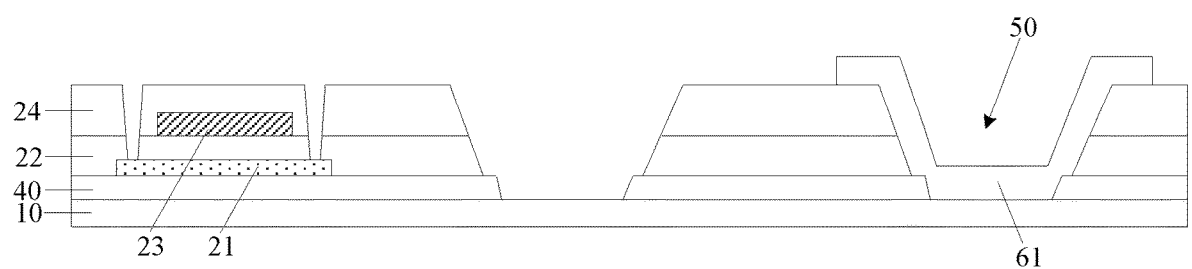
FIG. 14f is a partial cross-sectional view showing the formation of the first through-hole on basis of FIG. 14d.
Figure 14G:
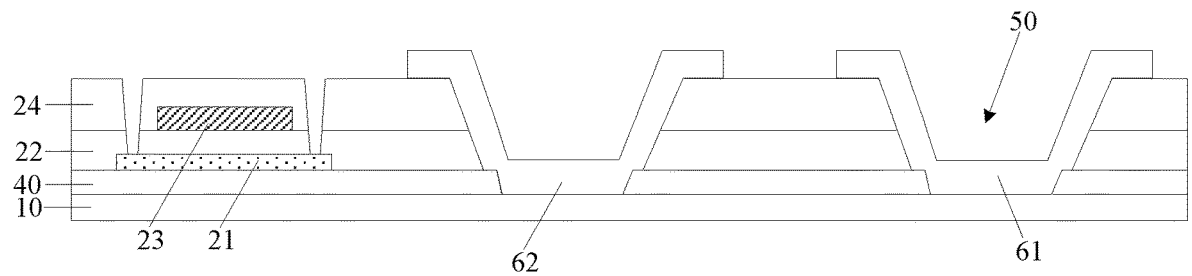
FIG. 14g is a partial cross-sectional view showing the formation of a first through-hole on basis of FIG. 14e.

In step S24, as shown in FIG. 14f, or as shown in FIG. 14g, a first through-hole penetrating through the first interlayer insulating layer 24 and the first gate insulating layer 22 is formed.

In step S25, referring to FIG. 8, a first source electrode 25 and a first drain electrode 26 are formed, and the first source electrode 25 and the first drain electrode 26 are in contact with the polysilicon active layer 21 through the first through-holes, respectively.

Here, FIG. 8 illustrates such a case that a first organic layer 61 is formed at the second through-hole 50 to cover the second through-hole 50.

In step S26, referring to FIG. 8, a second thin film transistor 30 is formed. The second thin film transistor 30 comprises a second gate electrode 31, a second gate insulating layer 32, an oxide active layer 33, a second source electrode 34, and a second drain electrode 35. The second gate electrode 31, or the second source electrode 34 and the second drain electrode 35, are formed by a same patterning process as the first source electrode 25 and the first drain electrode 26 are formed. The second gate insulating layer 32 covers the first source electrode 25 and the first drain electrode 26. The conductive layer 70 can be formed by a same patterning process as the first source electrode 25 and the first drain electrode 26 are formed; or can be formed by a same patterning process as the second source electrode 34 and the second drain electrode 35 are formed.

Taking that the second thin film transistor 30 is of a bottom gate type as an example, for the above steps S25 and S26, specifically, the first source electrode 25 and the first drain electrode 26 are formed first, and the second gate electrode 31 is simultaneously formed, and then a second gate insulating layer 32, an oxide active layer 33, a second source electrode 34, and a second drain electrode 35 are formed.

The second gate insulating layer 32 also covers the first source electrode 25 and the first drain electrode 26. That is, the second gate insulating layer 32 also serves as a protective layer for the first thin film transistor 20 at this time.

Based on the above, in some embodiments, as shown in FIGS. 7, 9, and 10, the preparation method further comprises: forming a capacitor insulating layer 28 which will be disposed between the first gate insulating layer 22 and the first interlayer insulating layer 24, a capacitor lower electrode 27 which can be formed in synchronization with the first gate electrode 23 and located between the capacitor insulating layer 28 and the first gate insulating layer 22, and a capacitor upper electrode 29 which will be located between the capacitor insulating layer 28 and the first interlayer insulating layer 24. The first insulating layer further comprises the capacitor insulating layer 28. The capacitor upper electrode 29 is disposed opposite to the capacitor lower electrode 27 with the capacitor insulating layer 28 interposed therebetween.

The capacitor upper electrode 29, the capacitor insulating layer 28, and the capacitor lower electrode 27 constitute a capacitor. By adjusting the thickness of the capacitor insulating layer 28, a desired capacitance can be obtained, thereby the capacitor can be used to provide a storage voltage for the pixel driving circuit and compensate for the threshold voltage Vth of the driving transistor in the pixel driving circuit.

It should be noted that, based on that the first insulating layer further comprises the capacitor insulating layer 28, in the region of the second thin film transistor 30, when the first interlayer insulating layer 24, the first gate insulating layer 22, and the buffer layer 40 are removed, the capacitor insulating layer 28 is also removed. Similarly, for the second through-hole 50, the capacitor insulating layer 28 at the second through-hole 50 can also be removed.

The above embodiments are only parts of the specific embodiments of the present disclosure, and the scope of the present disclosure shall not be limited thereto. Any of the embodiments disclosed herein can be combined with other embodiment(s) as appropriate to obtain additional embodiments. Those changes, modifications, or substitutions that can be obviously obtained by those skilled in the art from the present disclosure are intended to be embraced within the scope of the present disclosure. Therefore, the scope to be protected of the present application shall be defined by the claims.

What is claimed is:

1. An array substrate comprising:
a first thin film transistor and a second thin film transistor over a substrate;
wherein the first thin film transistor comprises a first portion of a first insulating layer, the first insulating layer comprises a first recess corresponding to the second thin film transistor, and the second thin film transistor is located in the first recess;
wherein a thickness of a second portion of the first insulating layer, which is below a bottom of the first recess, is smaller than that of the first portion of the first insulating layer; and
wherein the first thin film transistor and the second thin film transistor are respectively a polysilicon thin film transistor and an oxide thin film transistor.

2. The array substrate according to claim 1, wherein the second portion of the first insulating layer has a thickness of 0 μm.

3. The array substrate of claim 1, further comprising:
a buffer layer disposed between a surface of the substrate and the first thin film transistor;
wherein the buffer layer comprises a second recess corresponding to the second thin film transistor, and the first recess and the second recess are stacked; and
wherein, a thickness of a portion of the buffer layer, which is below a bottom of the second recess, is smaller than that of a portion of the buffer layer which is below the first thin film transistor.

4. The array substrate of claim 1,
wherein the first thin film transistor is a top gate type thin film transistor, and the first thin film transistor comprises at least one of a first gate insulating layer or a first interlayer insulating layer; and
wherein the first insulating layer comprises the first gate insulating layer and/or the first interlayer insulating layer.

5. The array substrate of claim 4, wherein
the first thin film transistor further comprises a first source electrode and a first drain electrode;
the second thin film transistor comprises a second gate electrode, a second source electrode, and a second drain electrode;
one of the following is disposed in a same layer as the first source electrode and the first drain electrode are disposed:
the second gate electrode, or
the second source electrode and the second drain electrode.

6. The array substrate of claim 1, further comprising:
a lead region, the lead region having a through-hole which comprises a first sub-through-hole and a second sub-through-hole which are stacked, the second sub-through-hole being disposed adjacent to the substrate, and an aperture of the second sub-through-hole being smaller than an aperture of the first sub-through-hole; and
a conductive layer disposed at the second sub-through-hole.

7. The array substrate according to claim 6, wherein
the first recess penetrates through same layer or layers as the first sub-through-hole penetrates through; and the second recess penetrates through same layer or layers as the second sub-through-hole penetrates through.

8. The array substrate of claim 6, wherein the substrate is a flexible substrate;
the array substrate further comprising a first organic layer disposed at the through-hole,
wherein the first organic layer is located on a side of the conductive layer, which is adjacent to the substrate, and the first organic layer covers a bottom surface and a side surface of the through-hole.

9. The array substrate according to claim 8, further comprising:
a second organic layer,
wherein the second thin film transistor is disposed over the second organic layer; and
wherein the second organic layer is disposed in a same layer as the first organic layer is disposed.

10. The array substrate of claim 1, wherein at least a portion of the second thin film transistor is disposed directly on the substrate.

11. A display panel comprising the array substrate of claim 1.

* * * * *